US006977551B2

(12) United States Patent
Ichitsubo et al.

(10) Patent No.: US 6,977,551 B2
(45) Date of Patent: Dec. 20, 2005

(54) DUAL BAND POWER AMPLIFIER MODULE FOR WIRELESS COMMUNICATION DEVICES

(75) Inventors: Ikuroh Ichitsubo, Kanagawa (JP); Guan-Wu Wang, Palo Alto, CA (US); Weiping Wang, Palo Alto, CA (US)

(73) Assignee: Micro Mobio, Palo Alto, CA (US)

( * ) Notice: Subject to any disclaimer, the term of this patent is extended or adjusted under 35 U.S.C. 154(b) by 55 days.

(21) Appl. No.: 11/064,261

(22) Filed: Feb. 24, 2005

(65) Prior Publication Data

US 2005/0140436 A1    Jun. 30, 2005

Related U.S. Application Data

(63) Continuation-in-part of application No. 10/385,058, filed on Mar. 9, 2003, now Pat. No. 6,774,718.

(60) Provisional application No. 60/397,261, filed on Jul. 19, 2002.

(51) Int. Cl.[7] .............................................. H03G 3/10
(52) U.S. Cl. .................................... 330/279; 330/129
(58) Field of Search ................................ 330/279, 129, 330/136; 455/126

(56) References Cited

U.S. PATENT DOCUMENTS

| | | | |
|---|---|---|---|
| 6,148,220 A | * | 11/2000 | Sharp et al. ................. 455/572 |
| 6,678,506 B1 | * | 1/2004 | Dolman et al. ........... 455/127.3 |
| 6,798,287 B2 | * | 9/2004 | Wu et al. .................... 330/129 |

* cited by examiner

Primary Examiner—Henry Choe
(74) Attorney, Agent, or Firm—Tran & Associates

(57) ABSTRACT

A power amplifier module for amplifying radio frequency signals includes first and second radio frequency power amplifiers with one or more semiconductor transistors, adapted to receive an input radio frequency signal and a processed power-sensing control signal and to output an amplified radio frequency signal; first and second power-sensing circuits each coupled to said first and second radio frequency power amplifiers and adapted to receive each amplified radio frequency signal and to output the power-sensing control signal; and control logic that receives and processes the power-sensing control signals, and outputs a processed power-sensing control signal in response to each quality or magnitude of each amplified radio frequency signal.

18 Claims, 6 Drawing Sheets

DUAL BAND POWER AMPLIFIER MODULE FOR WIRELESS COMMUNICATION DEVICES

RELATED APPLICATION

This application is a continuation-in-part of application Ser. No. 10/385,058 filed on Mar. 9, 2003, now U.S. Pat. No. 6,774,718, titled "Power Amplifier Module for Wireless Communication Devices", which in turn claims priority to Provisional Application Ser. No. 60/397,261, filed on Jul. 19, 2002, titled "Power Amplifier Modules for Wireless LAN Applications", the contents of which are incorporated by reference. The application claims priority to Provisional application Ser. No. 10/633,149 filed Dec. 3, 2004. The application is also related to the commonly assigned U.S. patent application Ser. No. 10/041,863, filed on Oct. 22, 2001, titled "Multilayer RF Amplifier Module", by Wang, et al., and the commonly assigned and concurrently filed U.S. patent application "Accurate Power Sensing Circuit for Power Amplifiers" by Ichitsubo et al. The disclosures of these related applications are incorporated herein by reference.

The present invention is related to the commonly assigned U.S. patent application Ser. No. 10/041,863, filed on Oct. 22, 2001, titled "Multilayer RF Amplifier Module", by Wang, et al., the commonly assigned and concurrently filed U.S. patent application "Accurate Power Sensing Circuit for Power Amplifiers" by Ichitsubo et al., and Ser. No. 10/039,687, filed on Jan. 19, 2005, titled "Multi-band Power Amplifier Module for Wireless Communication Devices". The disclosures of these related applications are incorporated herein by reference.

BACKGROUND

The present invention relates to radio frequency (RF) power amplifiers (PA) module.

Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of the wireless communication device is the radio frequency PA. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled on a printed circuit board (PCB) in which the components are interconnected by layers printed metal circuits and layers of dielectric substrates.

One consideration for wireless devices is to properly control the quality and power level of the amplified RF signals to be transmitted. In particular for high data rate wireless communications, the amplification of RF signals is required to be linear over a wide signal power range and over a given frequency range. Preferably the amplification is reduced or increased according to input RF signal, transmittance range and data rate so that power consumption can be optimized.

Other considerations in using wireless devices include good grounding and RF signal isolation. A power amplifier typically has high current flowing through the circuit. A non-zero impedance in the circuit can easily induce a voltage, potentially injecting unwanted noise into the RF system. Poor circuit board grounding can thus cause unintended feedback and oscillations. The ground current paths and the current handling capability of components have to be considered carefully. Since RF circuits operate at high power and high signal frequencies, electromagnetic radiation created can interfere with other components of the wireless communication device, or with other electronic devices.

Another consideration in the miniaturization of RF amplifier circuits is the required impedance matching for the input and output RF signals of the amplifier. Input and output impedance matching circuits typically include capacitors, resistors, and inductors in associated transmission lines or micro strips for the RF signals into and out of the amplifier chip. However, these impedance matching circuits may require specifically tailored off-chip components located remotely from the amplifier IC chip. Accordingly, the application circuitry must include many electrical input and output terminals or bonding Pins to which the corresponding portions of the off-chip impedance matching circuits are separately joined. This increases the difficulty of assembly and required size of the associated components, and affects the overall manufacturability of the portable devices.

SUMMARY

In a first aspect, a dual power amplifier module for amplifying radio frequency signals includes first and second radio frequency power amplifiers with one or more semiconductor transistors and adapted to receive an input radio frequency signal and a processed power-sensing control signal and to output an amplified radio frequency signal; first and second power-sensing circuits each coupled to said first and second radio frequency power amplifiers and adapted to receive each amplified radio frequency signal and to output the power-sensing control signal; and control logic that receives and processes the power-sensing control signals, and outputs a processed power-sensing control signal in response to each quality or magnitude of each amplified radio frequency signal.

In another aspect, a power amplifier (PA) module for amplifying radio frequency signals includes first and second radio frequency power amplifiers with one or more semiconductor transistors, adapted to receive an input radio frequency signal and power control signals and to output an amplified radio frequency signal. The power amplifier module is integrated with input and output impedance matching networks and a power sensor that is adapted to receive the amplified radio frequency signals and to output a signal indicating the power output level of the power amplifier module. The power amplifier module also includes control logic in accordance to at least one of the qualities and the power level of the amplified radio frequency signal.

The PA module disclosed is a linear amplifier which provides good linearity and low harmonics over a wide frequency range covering from several megahertz (MHZ) to tens of gigahertz (GHZ) by the feedback control based on the qualities and power level of the amplified radio frequency signal. Specifically, high order inter-modulation distortions are suppressed. The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, IEEE 802.11 and others. The PA module in accordance to the present invention especially provides reliable amplification to the Wireless Local Area Network (WLAN) applications.

In another aspect, a number of electronic components and circuits are integrated within the RF amplifier module, including impedance matching circuits for input and output RF signals. The RF amplifier module is compact and has smaller foot print compared to prior art implementations. The integrated RF amplifier module can be conveniently designed and assembled in a RF transmission device.

A feature of the present invention is the efficient grounding, shielding and thermal conduction provided in the RF amplifier module. The power amplifier circuit is fabricated on a semiconductor chip having an electrically conductive base. The RF power amplifier module includes a multi-layer three-dimensional substrate having a bottom metal layer adapted to bond with the printed circuit board (PCB) of a wireless communication device. The substrate has one or more upper layers adapted to receive the amplifier chip and other off-chip components. The bottom layer includes grounding metal Pins that are located at the center and at each corner, which is registered and adapted to bond with the circuit pattern on PCB of the wireless communication device. The metal Pins are connected to the upper layers through the multilayer three-dimensional substrate by a plurality of metal via holes Another feature of the PA module in the present invention is that the output signal from the power sensing circuit can be used to optimally control the bias current and operation characteristics of the power amplifiers. As a result, the PA module provides highly linear output power at reduced current consumption.

Yet another feature of the invention is that the RF amplifier design enables manufacturing consistency since the input and output matching circuits are included in the module. Common problems related to the manufacturing tolerance of the matching circuit components are therefore eliminated. The RF amplifier design is adapted to high frequency circuitry by utilizing semiconductor materials such as Gallium Arsenide Heterojunction Bipolar Transistors (GaAs HBT).

Other advantages include the power amplifier is capable of amplifying radio frequency signals in a plurality of frequency bands with efficient circuit. The power amplifiers module include power sensing circuits and bias control circuits that optimally control the bias current and operation characteristics of the power amplifiers. As a result, the quality, the linearity, and current consumption of the amplified signals are significantly improved across a plurality of frequency bands over a wide dynamic range. The frequency range can cover from several megahertz (MHZ) to tens of gigahertz (GHZ).

The power sensing bias control circuits for different power amplifiers operating at different frequency bands can be integrated within the RF amplifier module. In particular, the power sensing and the bias control terminals can be shared among different power amplifiers to reduce footprint of the power amplifier module. The integrated RF amplifier module is therefore compact and lower cost.

A plurality of power supply terminals can be provided to supply power to each power amplifier. The flexibility of providing power from one or more power supply terminals enables greater amount power being supplied to the power amplifiers, which is crucial for wireless applications requiring high power amplification for Wi-Fi and Wi-Max applications.

The power amplifier circuit can be fabricated on semiconductor materials such as Gallium Arsenide Heterojunction Bipolar Transistors (GaAs HBT). The RF power amplifier module can include a multi-layer three-dimensional substrate or a lead frame having a bottom metal layer adapted to bond with the printed circuit board (PCB) of a wireless communication device. The substrate can include one or more upper layers adapted to receive the amplifier chip and other off-chip components. The bottom layer includes grounding metal Pins that are located at the center and at each corner, which is registered and adapted to bond with the circuit pattern on PCB of the wireless communication device. The metal Pins are connected to the upper layers through the multilayer three-dimensional substrate by a plurality of metal via holes.

The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, Universal Mobile Telecommunications System (UMTS), IEEE 802.11, IEEE 802.16 (Wi-Max), and others. The PA module in accordance to the present invention especially provides reliable amplification to the Wi-Fi and Wi-Max applications.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

In order that the manner in which the above recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

The accompanying drawings, which are incorporated in and form a part of this specification, illustrate embodiments of the invention and, together with the description, serve to explain the principles of the invention.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components.

Figure 1A:
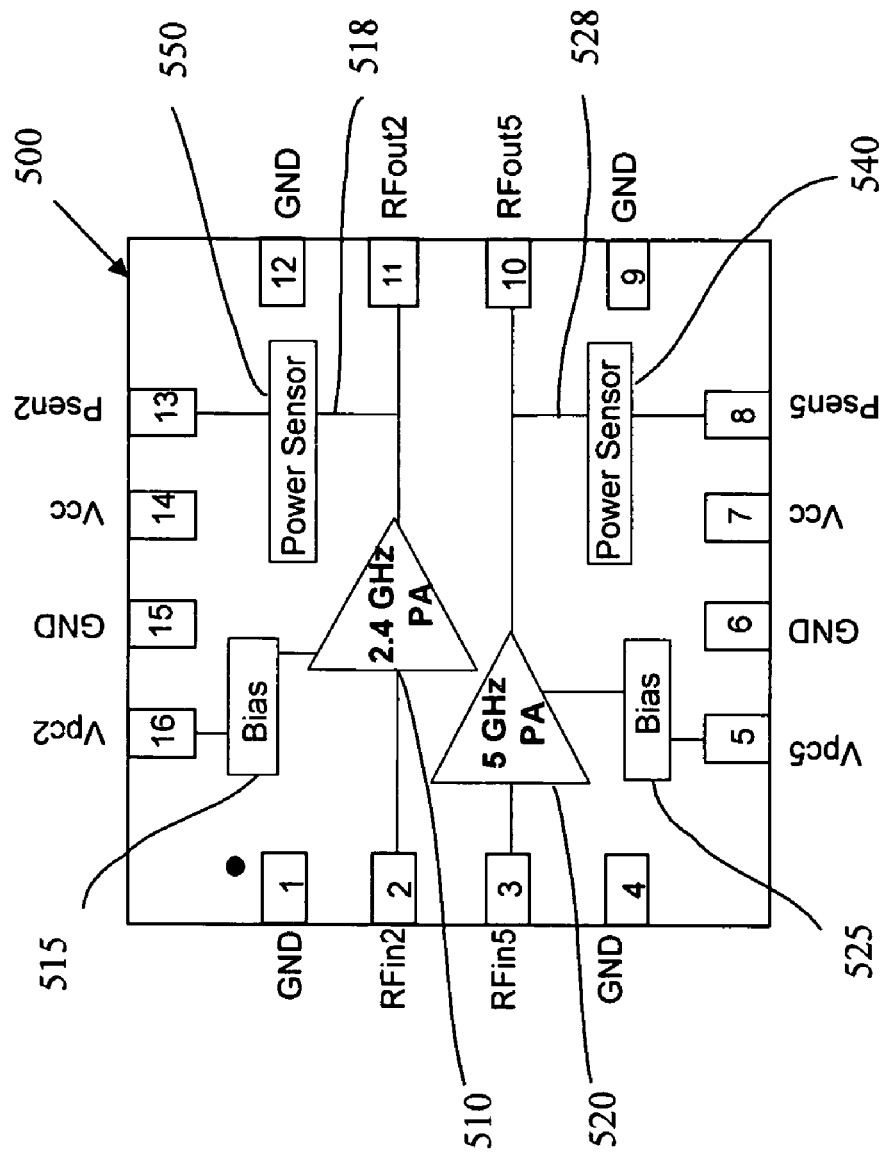
FIG. 1A illustrates a top view diagram of a power amplifier module capable of amplifying radio frequency signals at two radio frequency bands in accordance to an embodiment of the present invention.

FIG. 1A shows a dual-power amplifier module 500 which provides a unitary or common component that may be conveniently assembled in wireless devices such as cellular phone, mobile computers, handheld wireless digital devices, and for Wi-Fi and Wi-Max applications. The term "module" refers to such a unitary device for wireless communications, comprising integrated power amplifiers and other circuitry and auxiliary electronic components. The power amplifier module 500 is capable of amplifying radio frequency signals in a plurality of frequency bands.

As shown in the top view diagram of FIG. 1A, the power amplifier module 500 comprises a first power amplifier 510 and a second power amplifier 520. For example, the first power amplifier 510 can amplify radio frequency signals in a frequency band centered around 2.4 GHz. The second power amplifier 520 can amplify radio frequency signals in a frequency band centered around 5 GHz. The power amplifier module 500 is compatible with other radio frequencies such as 3.5 GHz, and 700 MHz, among others.

The power amplifier module 500 includes four sides and a plurality of metal electrodes (often referred as pins or terminals) along each side. The pins or terminals can provide RF signal input and control signal input to the power amplifiers as well as output RF or power sensing signals. As shown in FIG. 1A, the power amplifier module 500 includes an input side on the left having pins 1 and 4 as ground, and pin 2 (RFin2) and pin 3 (RFin5) respectively for receiving input RF signals for the first power amplifier 510 and the second power amplifier 520. The power amplifier module 500 also includes an output side on the right having pins 9 and 12 as ground, and pin 11 (RFout2) and pin 10 (RFout5) respectively for receiving output RF signals from the first power amplifier 510 and the second power amplifier 520. The upper side of the power amplifier module 500 includes pin 16 (Vpc2) for receiving input signals to bias control circuit 515 for the first power amplifier 510. The lower side of the power amplifier module 500 includes pin 5 (Vpc5) for receiving input signals to bias control circuit 525 for the second power amplifier 520.

In accordance with one embodiment of the present invention, pin 15 is grounded. In another embodiment, pin 15 is Gstep or gain step. GStep can take input voltage either "logical high" or "logical low". When the logical signal presented to the GStep is low, the RF input signals (RFin2 & RFin5) is amplified with a nominal gain, for example, 30 dB. When the logical signal presented to GStep is high, the gain of PA is reduced and power output is reduced.

Figure 1B:
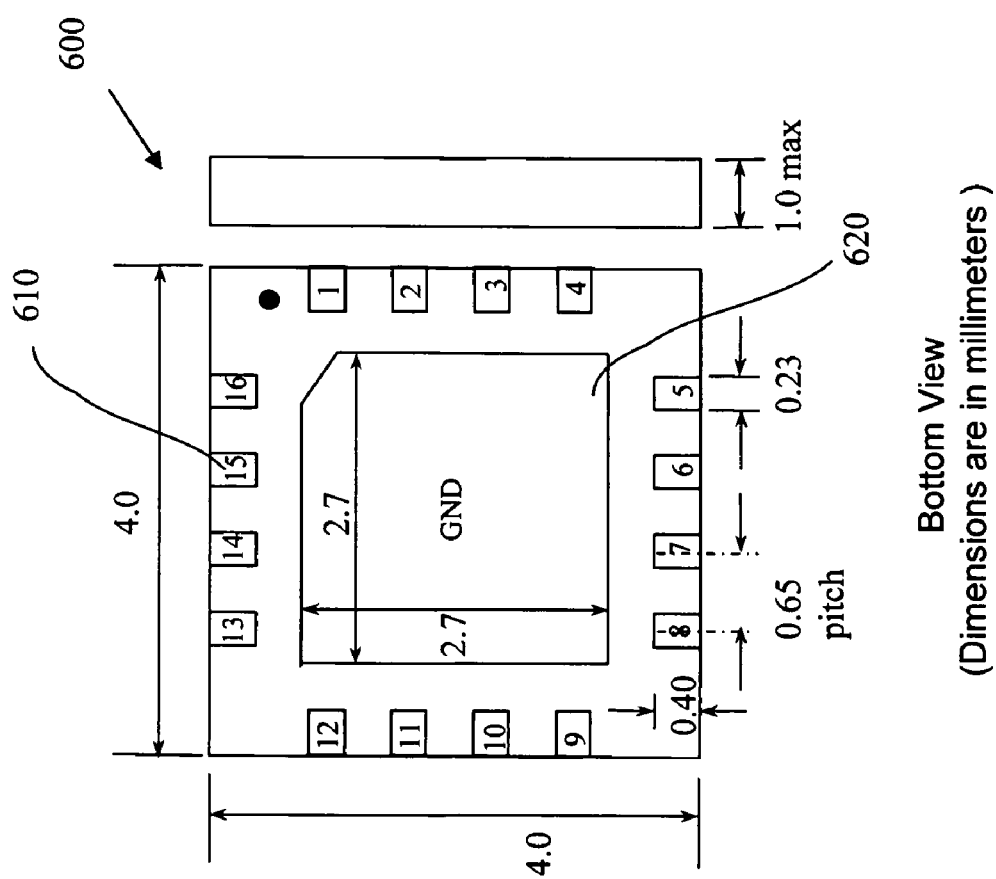
FIG. 1B is the diagram of the bottom-side footprint of the power amplifier module of FIG. 1A.

The bottom view of the power amplifier module 500 is shown in FIG. 1B. The pin-out 600 of the power amplifier module 500 when viewed from the bottom is flip symmetry of the pin-out when viewed from the top and further includes a ground pad 620. Exemplified dimensions are also labeled in FIG. 1B in millimeter) to show the small foot print of the power amplifier module 500 which are achieved by integrated circuit designs and shared electrodes between the power amplifiers for different frequency bands.

The power amplifier module 500 can further comprise frequency filter circuits and diplexers that can receive the input radio frequency signals and output a radio frequency signal at a selective frequency (e.g. one of 2.4 GHz and 5 GHz). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004, the disclosures of which are hereby incorporated by reference.

More details of the operations of the bias control circuits 515 and 525 and power sensing circuit 540 as well as the design and benefits of the electric grounding in wireless power amplifier modules are disclosed in the commonly assigned and the above mentioned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004. The disclosures of these applications are incorporated herein by reference.

Table 1 shows exemplary electrical characteristics and operating conditions for one embodiment of the device of FIG. 1A. As shown therein, between 2.4 and 2.5 GHz, the linear output is 20 dBm, the small signal gain is 31 dB, and the output harmonics is less than −50 dBc. Correspondingly, between 4.9 and 5.95 GHz, the linear output is 19 dBm, the small signal gain is 33 dB, and the output harmonics is less than −30 dBc. Hence, the device of FIG. 1A provides excellent responses at two separate frequency ranges so that multi-band wireless systems can be implemented.

TABLE 1

| Parameter | Min | Typical | Max | Unit | Condition |
|---|---|---|---|---|---|
| 2.4 GHz | | | | | |
| Operating Power Supply Voltage[1] | 2.8 | 3.3 | 3.6 | V | |
| Frequency Range | 2.4 | 2.45 | 2.5 | GHz | |
| Linear Output | | 20 | | dBm | |
| Small Signal Gain | | 31 | | dB | |
| Output Harmonics | | <−50 | | dBc | Pout = 20 dBm |
| Output Noise Level | | | −138 | dBm/Hz | |
| Power Control - Enable | 2.8 | | 3.6 | V | |
| Power Control - Disable | | <0.5 | | V | |
| Power Sensor Impedance | | <2 | | kΩ | |
| Quiescent Current | | 45 | | mA | |
| Input VSWR | | <2:1 | | | |
| DC Supply Current | | 150 | | mA | Vcc = 3.3 V, Pout = 20 dBm |
| DC Supply Current[1] | | | 300 | mA | At Max Pout |
| 5 GHz | | | | | |
| Operating Power Supply Voltage[1] | 2.8 | 3.3 | 3.6 | V | |
| Frequency Range | 4.9 | | 5.95 | GHz | |
| Linear Output | | 19 | | dBm | |
| Small Signal Gain | | 33 | | dB | |
| Output Harmonics | | <−30 | | dBc | Pout = 19 dBm |
| Output Noise Level | | | −138 | dBm/Hz | |
| Power Control - Enable | 2.8 | | 3.6 | V | |
| Power Control - Disable | | <0.5 | | V | |
| Power Sensor Impedance | | <2 | | kΩ | |
| Quiescent Current | | 170 | | mA | |
| Input VSWR | | <2:1 | | | |
| DC Supply Current | | 200 | | mA | Vcc = 3.3 V, Pout = 19 dBm |
| DC Supply Current[1] | | | 300 | mA | At Max Pout |

Figure 1C:
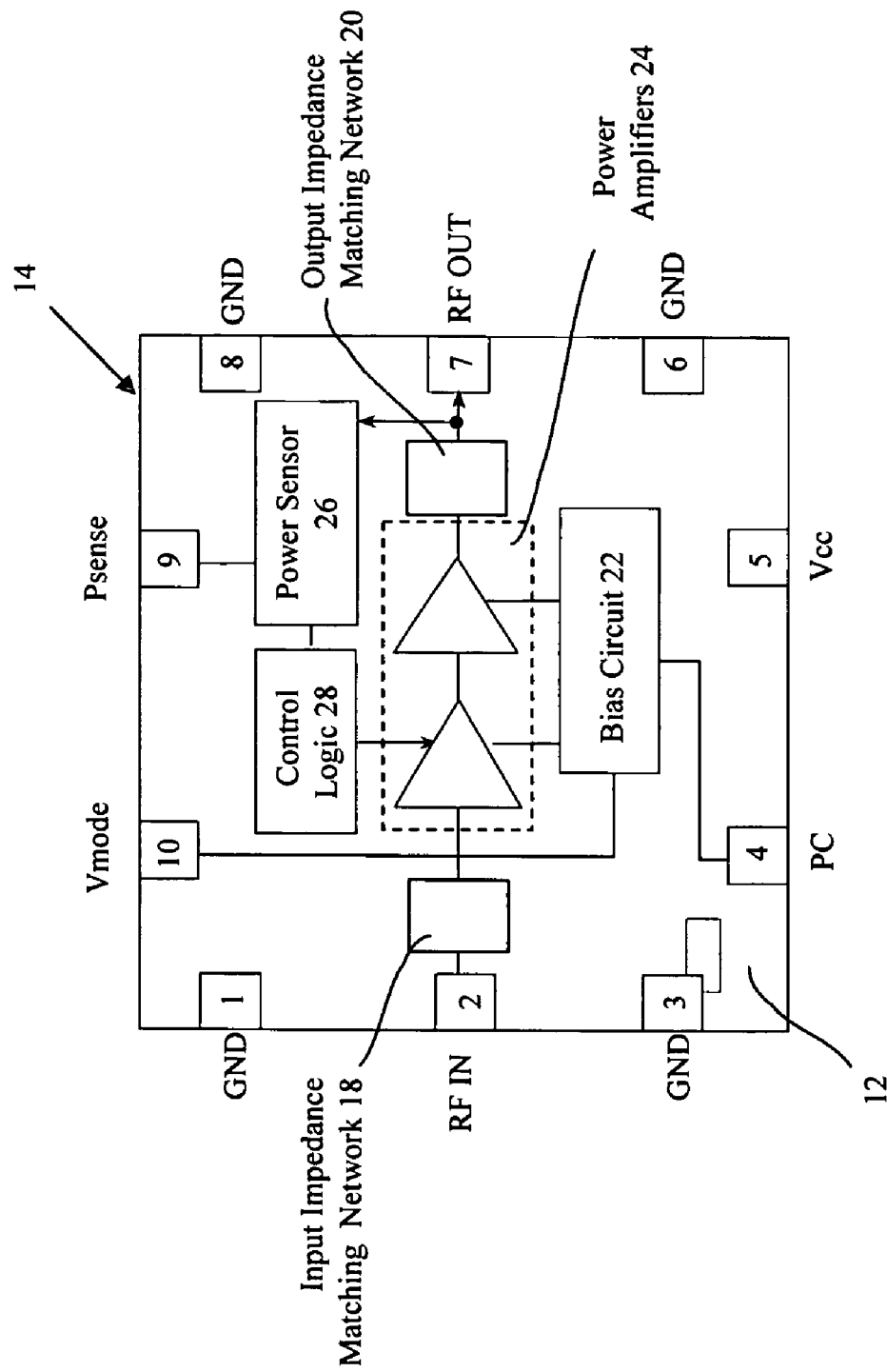
FIG. 1C is a system diagram of the power amplifier module for wireless communications.

FIG. 1C shows another embodiment with a single power amplifier. The PA module is built on a substrate 12, which can be a multiplayer printed circuit board (PCB), lead frame, lower-temperature co-fired ceramics (LTCC), or other suitable electronic materials. The substrate includes metal Pins adapted to receive connecting terminals of integrated circuits including the Power Amplifiers 24, the Bias Circuit 22, the Power Sensor 26, and optionally Control Logic 28. The Power Amplifiers 24, the Power Sensor 10 26, the Bias Circuit 22, can be fabricated in an integrated circuit on a semiconductor chip. The Power Amplifiers 24 can be of one or multiple stages. In the particular example shown in FIG. 1C, two sequentially connected stages of power transistors are employed. The amplifier IC chip has an electrically conductive metal layer to be bonded to the top metal layer of the module.

The PA module 14 can also include, in accordance with another feature of the present invention, input impedance matching circuit 18 and output impedance matching circuit 20. The input and output impedance matching networks are preferably based on the 50-ohm standard of the RF industry. Details of impedance matching circuits are described in the above referenced and commonly assigned U.S. patent application Ser. No. 10/041,863, filed on Oct. 22, 2001, titled "Multilayer RF Amplifier Module ", by Wang, et al.

The Bias Circuit 22 is used to bias individual stage with suitable current so the amplifiers can operate with minimal signal distortion. The Bias Circuit receives input from the power control signal from the PC port (Pin 4) and can be selected to operate at different settings of idle current using the Vmode port (Pin 10). In accordance with the present invention, the mode control signal and the power-control signal may be dependent at least partially on the power-sensing signal output from the Power Sensor circuit 26.

The PA module is integrated with a Power Sensor circuit 26 that senses the level of the output power. Details of the power sensor circuit are disclosed in the above referenced and commonly assigned U.S. patent application "Accurate Power Sensing Circuit for Power Amplifiers" by Ichitsubo et al., the disclosures of which related application are incorporated herein by reference.

A power amplifier with good linearity generally must maintain a constant amplification factor, known as "Gain", which is defined as the ratio of the output signal power level to the input signal power level. However, at high output power level, the power amplifier can be driven close to saturation and a constant gain becomes difficult to maintain. As a result, the quality of digital communication, commonly measured by Error Vector Magnitude (EVM), Bit Error Rate (BER), or Packet Error Rate (PER), degrades at high output power level.

The Power Sensor 26 receives the amplified radio frequency signal from Power Amplifiers 24 and to output a power-sensing control signal. The Control Logic 28 receives and processes the power-sensing control signal, and outputs a processed power-sensing control signal to control Power Amplifiers 24. The processed power-sensing control signal is a function of a quality or a magnitude of the amplified radio frequency signal. For example, the Control Logic 28 improves the linearity performance of power amplifier using the Power Sensor 26 feedback internally. By adjusting the bias of the amplifier depending on the actual output power measured by the Power Sensor 26, it reduces the tendency of saturation and maintains a more constant gain. Thus the linearity of the amplification over a wide range of power is improved. Yet another method of improving the quality of digital communication is to use an external controller to adjust the input RF signal based the known relationship of digital communication quality to output power level.

The PA module 14 shown in FIG. 1C can be used in a wide range wireless communication devices such as cellular phone, mobile computers, and handheld wireless digital devices. The PA module has a miniature size of a few millimeters.

Figure 2:
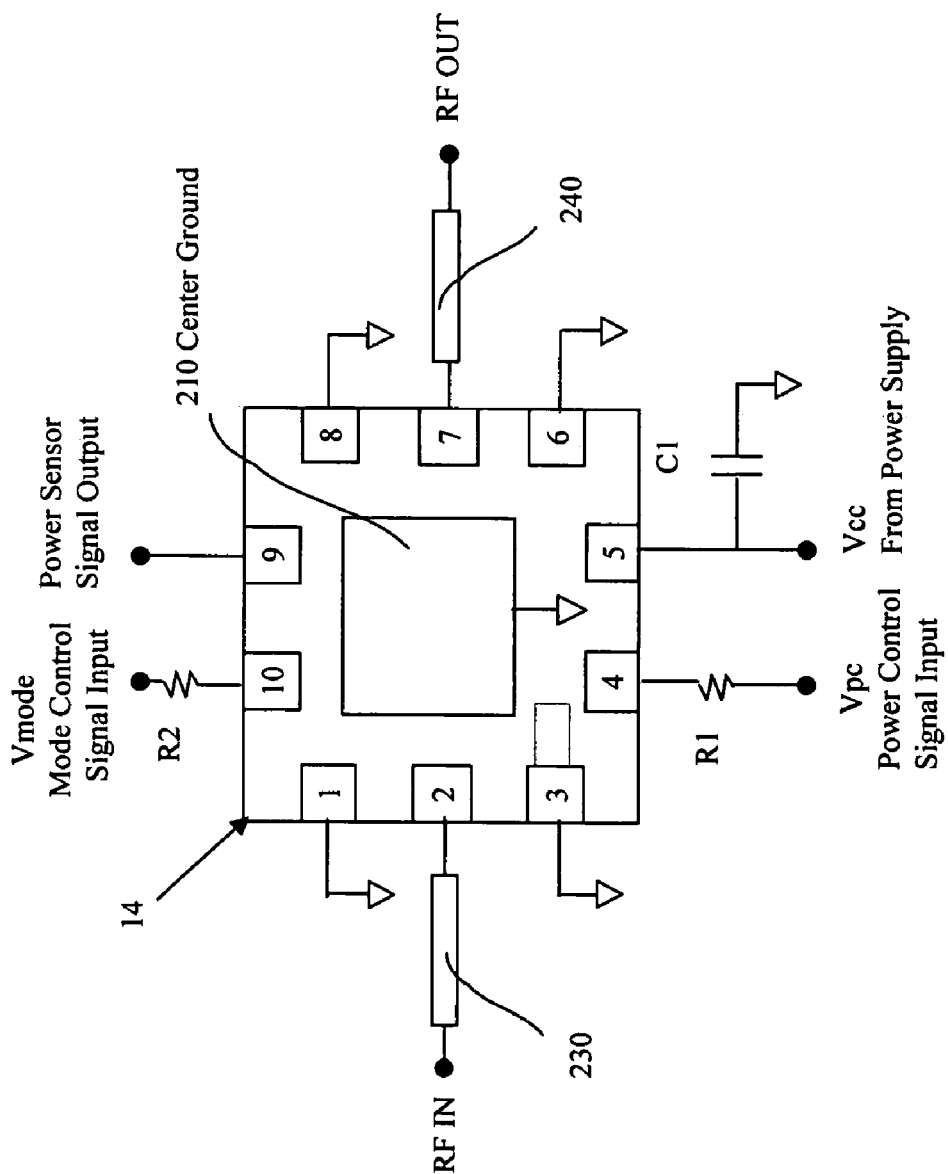
FIG. 2 is the electrical schematics for the application of the power amplifier module shown in FIG. 1C in accordance to an embodiment.

FIG. 2 is the electrical schematics illustrating the application of the PA module 14, as shown in FIG. 1C, to wireless communications in accordance to the present invention. The PA module has a plurality of metal Pins, namely, Pin 1 through 10 and the Center Ground 210. Pin 1, 3, 6 and 8 are adapted to be connected to the electric ground. Pin 2 (RF IN port) is connected through a 50-ohm transmission line 230 to an RF input signal to be supplied to the Power Amplifiers 24. The output of the power amplifier chip 24 is at Pin 7 (RF OUT port), also connected by a 50-ohm transmission line 240 to the antenna stage, possibly with a filter and transmit/receive switch in between. Pin 4 (PC port) receives a power control signal, while Pin 5 (Vcc port) receives DC power supply. Pin 9 (Psense port) provides a power sensing signal output, while Pin 10 (Vmode port) optimally receives a mode control signal. A series resistor $R_2$ can be used to set the DC voltage to Vmode advantageously depending on the requirement of linear power output or the characteristics varying RF signal.

The power supply may come from a regulated voltage source to the Vcc port. The PA can be switched ON/OFF by presenting a high and low signal at the PC port. The voltage of high signal the PC port may be optimally adjusted with an external resistor R1. When it is switched to the OFF state, the bias to the power amplifier is shut off and the current consumption is reduced to very small.

In one embodiment, the input impedance matching network 18, the output impedance matching network 20, the power amplifiers 24, the bias circuit 22 and the power sensor 26 are integrated on an integrated circuit (IC). The IC includes top terminals or bonding Pins which provide various input and output connections to the internal components of the chip. The top terminals are electrically joined to one or more of the plates in the substrate 12. In the preferred embodiment, the chip includes Gallium Arsenide Heterojunction Bipolar Transistors (GaAs HBT). However, other semiconductor materials may also be used.

Figure 3:
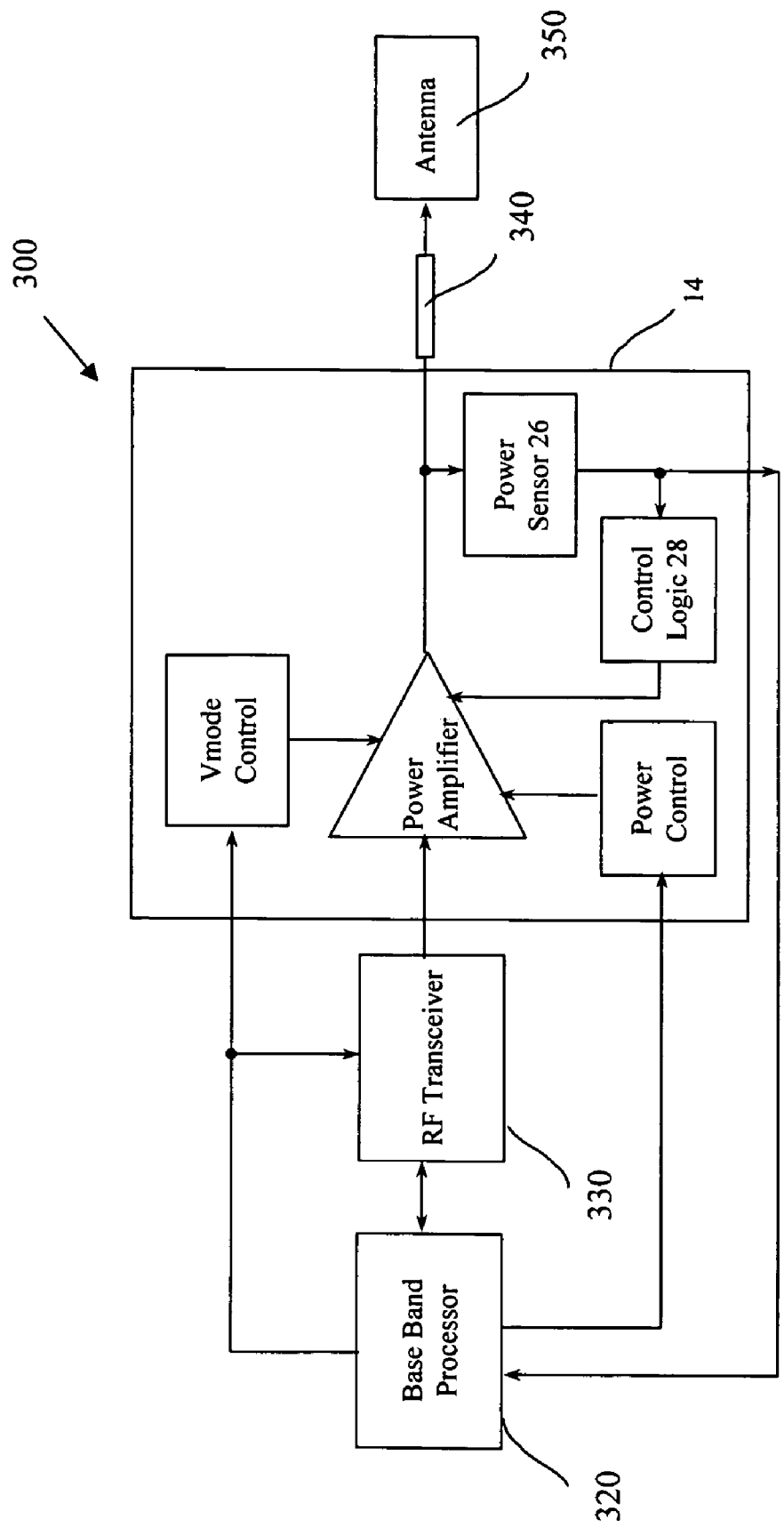
FIG. 3 illustrates the use of the power amplifier module for wireless communications in accordance to an embodiment.

FIG. 3 illustrates an exemplary use of the radio frequency PA module for digital wireless communications in accordance to the present invention. The wireless communication device 300 can be a PDA, a WLAN adaptor, or a cellular phone. The wireless communication device 300 includes a base band processor core 320, RF transceivers 330, PA module 14, and a 50-ohm impedance transmission line or micro strip 340 connected to antenna 350.

A base band chip generates digitally modulated signals. The frequency is up-converted by a RF transceiver to a RF frequency band suitable for transmitting. The RF signal is amplified by the PA module 14 for transmitting by the antenna. The PA module can be turned ON/OFF by the power control signal. The Vmode control (Pin 10) is used to control and internal settings of the bias circuits by the base band processor 320 which has the knowledge of the digital signal modulation type and the linear output requirement. For example, when the device is transmitting high power, the Vmode control pin set the power amplifier operating in high current to minimize output distortion. When the device needs to transmit low power, the Vmode control pin 10 sets the power amplifier with low current to conserve battery life.

The Power Sensor 26 measures the output RF power, which can be advantageously used externally to the PA module. For example, the output of power sensor can be used by the baseband processor 320 to set the transmitting power level for the wireless device by varying the RF input signal to PA module.

Figure 4:
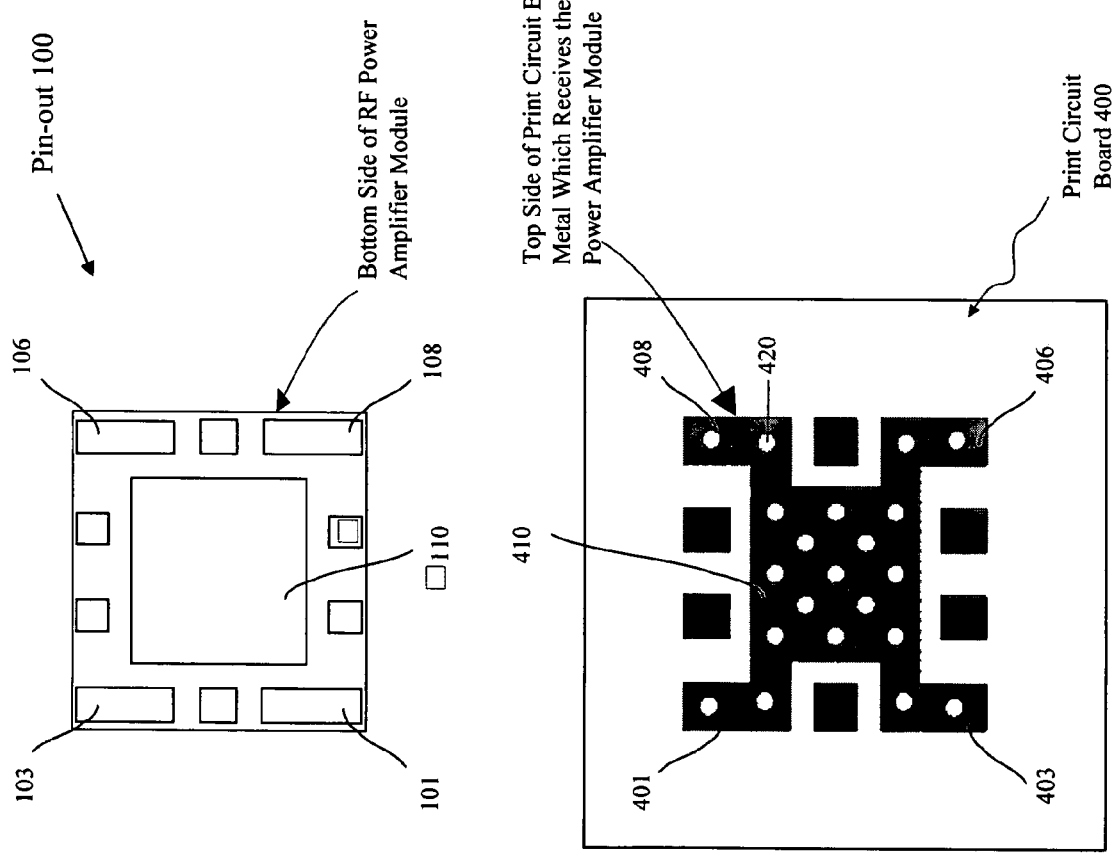
FIG. 4 show exemplary diagrams of the bottom-side footprint of the power amplifier module of FIG. 1C and the printed-circuit-board layout of a wireless communication device, on which the power amplifier module is mounted in accordance to an embodiment.

FIG. 4 is a diagram of the pin-out and the footprint of the PA module in accordance with the present invention. The pin-out 100 shows the bottom side of the PA module that includes a multitude of metal electrodes and an insulating substrate. The physical metal pads 101, 103, 106, 108 in FIG. 4 correspond to grounding Pins 1, 3, 6, 8 of the circuit diagram in FIG. 2. The center ground 110 in FIG. 4 corresponds to 210 in FIG. 2.

The center ground 110 serves as major path for dissipating heat generated by the amplifiers. To keep the power amplifier run without excessive temperature, it is important to minimize the heat transfer resistance of the power amplifier to external space on printed circuit. It is also desirable to have minimal electrical resistance for the current flowing between the center ground 110 to the ground of the circuit board of the wireless device.

In the typical application for a wireless communication device, the PA module 14 is electrically mounted to a printed circuit board 400 in the wireless communication device. The circuit board includes a grounding circuit design at the location where the PA module is mounted. The grounding circuit design consists of a metal land 410 and four connecting metal lands 401, 403, 406, and 408 adjacent to the four corners of 410. When the PA module is mounted to the printed circuit board 400, pins 110, 101, 103, 106 and 108 on the bottom surface of the PA module are mated and connected to 410, 401, 403, 406 and 408, respectively.

The metal circuit 410, 401, 403, 406 and 408 are further connected to a ground plane layer of the circuit board, typically below the RF signal layer, by "via holes" 420. The metal structure together with the via holes illustrated in FIGS. 4 enables effective current flowing from the bottom conductive layer of the amplifier IC chip to the central metal land 410, out to the metal land 401, 403, 406, 408, and continuing down to the ground plane layer by the "via holes" 420.

The grounding structure also provides efficient heat dissipation from the amplifier IC chip in a similar fashion. The design described above is used advantageously to enhance heat transfer capability so the heat can be dissipated horizontally from the center as well as vertically by metal circuit 410, 401, 403, 406, 408 and via holes 420. Both the horizontal and the vertical means of metal circuits together provide a good 3-dimensional topology for heat dissipation path.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. For example, the frequency of a power amplifier is not restricted to 2.4 GHz or 5 GHz. The described system is compatible with power amplification at 3.5 GHz, 700 MHz, or any other radio frequencies. The following claims are intended to encompass all such modifications.

What is claimed is:

1. A power amplifier module for amplifying radio frequency signals, comprising:
   a) first and second radio frequency power amplifiers each including one or more semiconductor transistors, adapted to receive an input radio frequency signal and a processed power-sensing control signal, and to output an amplified radio frequency signal;

b) first and second power-sensing circuits each coupled to said first and second radio frequency power amplifiers and adapted to receive each amplified radio frequency signal and to output the power-sensing control signal; and c) control logic that receives and processes the power-sensing control signals, and outputs a processed power-sensing control signal in response to each quality or magnitude of each amplified radio frequency signal, wherein the quality or magnitude of the amplified radio frequency signal includes Error Vector Magnitude (EVM), Bit Error Rate (BER), or Packet Error Rate (PER).

2. The module of claim 1 wherein the quality of the amplified radio frequency signal includes one or more of inter-modulation components of the amplified radio frequency signal.

3. The module of claim 1 wherein the magnitude of the amplified radio frequency signal includes one or more of the gain, the voltage, the current, and the power of the amplified radio frequency signal.

4. The module of claim 1 wherein the radio frequency power amplifier outputs the amplified radio frequency signal under the control of a bias signal.

5. The module of claim 4 wherein the bias signal is controlled by the power-sensing control signal.

6. The module of claim 1, wherein the impedance of the external circuit that provides the input radio frequency signal is matched by an input impedance matching circuit.

7. The module of claim 1, wherein the impedance of external circuit that receives the amplified radio frequency signal is matched by an output impedance matching circuit.

8. The module of claim 1, further comprising
an electrically conductive base; and
a multi-layer three dimensional substrate having a conductive layer adapted to bond with the electrically conductive base.

9. The module of claim 8 wherein the conductive layer includes a central metal land adapted to bond with the electrically conductive base of the electronic circuit, said central metal land connected with metal pins at the corners of the conductive layer.

10. The module of claim 9 wherein the central metal land and the metal pins of the conductive layer includes a plurality of via holes through the upper layers in the multilayer three-dimensional substrate.

11. A wireless communication device for transmitting and receiving radio frequency signals, comprising
a) first and second power amplifier module for amplifying radio frequency signals, each comprising:
i) a radio frequency power amplifier including one or more semiconductor transistors, adapted to receive an input radio frequency signal and a processed power-sensing control signal, and to output an amplified radio frequency signal; and b) first and second power-sensing circuits coupled to said first and second power amplifier modules, said power-sensing circuits including a control logic adapted to receive and process the amplified radio frequency signals and to output the processed power-sensing control signal in response to each quality or a magnitude of the amplified radio frequency signal, and c) first and second antennas adapted to provide the input radio frequency signals to the power amplifier modules and to receive the output radio frequency signals from the power amplifier modules wherein the quality or magnitude of the amplified radio frequency signal includes Error Vector Magnitude (EVM), Bit Error Rate (BER), or Packet Error Rate (PER).

12. The module of claim 11 wherein the quality of the amplified radio frequency signal includes one or more of inter-modulation components of the amplified radio frequency signal.

13. The module of claim 11 wherein the magnitude of the amplified radio frequency signal includes one or more of the gain, the voltage, the current, and the power of the amplified radio frequency signal.

14. The module of claim 11, further including an input impedance matching circuit and/or an output impedance matching circuit.

15. The module of claim 11, further including a base band processor and/or a RF transceiver.

16. A power amplifier module for amplifying radio frequency signals, comprising:
a) an electronic circuit including
i) first and second radio frequency power amplifiers each including one or more semiconductor transistors, adapted to receive an input radio frequency signal and a power-sensing control signal, and to output an amplified radio frequency signal;
ii) first and second power-sensing circuits coupled to said first and second radio frequency power amplifiers and each adapted to receive the amplified radio frequency signal and to output the power-sensing control signal;
iii) an electrically conductive base; and
b) a three dimensional substrate having a conductive layer adapted to bond with the electrically conductive base.

17. The module of claim 16 wherein the conductive layer includes a central metal land adapted to bond with the electrically conductive base of the electronic circuit, said central metal land being connected with metal pins at the corners of the conductive layer.

18. The module of claim 16 wherein the central metal land and the metal pins of the conductive layer includes a plurality of via holes through the upper layers in the three-dimensional substrate.

* * * * *